United States Patent
Lin et al.

(10) Patent No.: US 11,728,170 B2
(45) Date of Patent: Aug. 15, 2023

(54) CONTACT STRUCTURE

(71) Applicant: Taiwan Semiconductor Manufacturing Co., Ltd., Hsinchu (TW)

(72) Inventors: Hong-Ying Lin, Hsinchu (TW); Cheng-Yi Wu, Taichung (TW); Alan Tu, Hsinchu (TW); Chung-Liang Cheng, Changhua County (TW); Li-Hsuan Chu, Taichung (TW); Ethan Hsiao, Hsin-Chu (TW); Hui-Lin Sung, Hsin-Chu (TW); Sz-Yuan Hung, Hsin-Chu (TW); Sheng-Yung Lo, Hsin-Chu (TW); C. W. Chiu, Hsin-Chu (TW); Chih-Wei Hsieh, Hsin-Chu (TW); Chin-Szu Lee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 14 days.

(21) Appl. No.: 17/370,684

(22) Filed: Jul. 8, 2021

(65) Prior Publication Data
US 2021/0335616 A1 Oct. 28, 2021

Related U.S. Application Data

(63) Continuation of application No. 16/596,617, filed on Oct. 8, 2019, now Pat. No. 11,062,908, which is a (Continued)

(51) Int. Cl.
*H01L 21/285* (2006.01)
*H01L 21/768* (2006.01)
(Continued)

(52) U.S. Cl.
CPC .. *H01L 21/28556* (2013.01); *H01L 21/28568* (2013.01); *H01L 21/76805* (2013.01);
(Continued)

(58) Field of Classification Search
CPC ........ H01L 29/66545; H01L 29/66606; H01L 29/66871; H01L 29/66515; H01L 29/665;
(Continued)

(56) References Cited

U.S. PATENT DOCUMENTS

| 9,397,197 B1 | 7/2016 | Guo |
|---|---|---|
| 2009/0102058 A1 | 4/2009 | Hsieh |

(Continued)

FOREIGN PATENT DOCUMENTS

| CN | 101236954 A1 | 8/2008 |
|---|---|---|
| CN | 103348481 A1 | 10/2013 |

(Continued)

*Primary Examiner* — Sonya McCall-Shepard
(74) *Attorney, Agent, or Firm* — Duane Morris LLP

(57) ABSTRACT

A semiconductor device includes: a fin structure disposed on a substrate; a gate feature that traverses the fin structure to overlay a central portion of the fin structure; a pair of source/drain features, along the fin structure, that are disposed at respective sides of the gate feature; and a plurality of contact structures that are formed of tungsten, wherein a gate electrode of the gate feature and the pair of source/drain features are each directly coupled to a respective one of the plurality of contact structures.

20 Claims, 21 Drawing Sheets

Related U.S. Application Data continuation of application No. 15/797,869, filed on Oct. 30, 2017, now Pat. No. 10,763,116.

(51) Int. Cl.

| | | |
|---|---|---|
| *H01L 23/532* | (2006.01) | |
| *H01L 23/535* | (2006.01) | |
| *H01L 29/08* | (2006.01) | |
| *H01L 29/417* | (2006.01) | |
| *H01L 29/66* | (2006.01) | |
| *H01L 29/78* | (2006.01) | |
| *C23C 16/16* | (2006.01) | |

(52) U.S. Cl.
CPC .. *H01L 21/76832* (2013.01); *H01L 21/76895* (2013.01); *H01L 23/535* (2013.01); *H01L 23/53257* (2013.01); *H01L 23/53295* (2013.01); *H01L 29/0847* (2013.01); *H01L 29/41791* (2013.01); *H01L 29/66545* (2013.01); *H01L 29/66795* (2013.01); *H01L 29/785* (2013.01); *H01L 29/7851* (2013.01); *C23C 16/16* (2013.01)

(58) Field of Classification Search
CPC ......... H01L 29/7855–7856; H01L 2029/7858; H01L 29/41725–41791; H01L 29/7839; H01L 29/806; H01L 21/823418; H01L 21/823814; H01L 21/823475; H01L 21/823871; H01L 29/7851; H01L 23/5226; H01L 21/76877–76883; H01L 21/7684; H01L 23/53257–53266; H01L 21/76897; H01L 23/5329–53295; H01L 21/76801–76837; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/76802–76817; H01L 21/76895; H01L 21/76832; H01L 23/53295
See application file for complete search history.

(56) References Cited

U.S. PATENT DOCUMENTS

| | | |
|---|---|---|
| 2012/0193712 A1 | 8/2012 | Bryant et al. |
| 2013/0127058 A1 | 5/2013 | Lavoie et al. |
| 2014/0011358 A1 | 1/2014 | Chen et al. |
| 2015/0060960 A1 | 3/2015 | Xie et al. |
| 2015/0187896 A1 | 7/2015 | Kamineni et al. |
| 2016/0204100 A1 | 7/2016 | Zhang |
| 2018/0096934 A1* | 4/2018 | Siew ................ H01L 23/535 |
| 2018/0130886 A1 | 5/2018 | Kim |
| 2018/0301371 A1* | 10/2018 | Wang ............. H01L 29/7851 |

FOREIGN PATENT DOCUMENTS

| | | |
|---|---|---|
| CN | 103378156 A | 10/2013 |
| CN | 103681285 A | 3/2014 |
| CN | 103928518 A | 7/2014 |
| CN | 104241131 A | 12/2014 |
| CN | 104752339 A | 7/2015 |
| TW | 201413033 A | 4/2014 |

\* cited by examiner

CONTACT STRUCTURE

CROSS-REFERENCE TO RELATED APPLICATION

This application is a continuation of U.S. patent application Ser. No. 16/596,617, filed Oct. 8, 2019, which is a continuation application of U.S. patent application Ser. No. 15/797,869, filed Oct. 30, 2017, each of which are incorporated by reference herein in their entireties.

BACKGROUND

As integrated circuit (IC) scaling proceeds into the deep sub-nanometer regime, the number of transistors on high performance, high density ICs is in the tens of millions, in accordance with the historical trend of Moore's Law. This has necessitated scaling down respective interconnection structures of the IC accordingly. In particular, tungsten (W) has been used for the interconnection structures (e.g., contact plugs, vias, and other interconnection lines, etc.) that are relatively closer to respective transistors of the IC. This is partially because copper (Cu), which is typically used for another major portion of the interconnection structures that are relatively farther from the transistors, may "poison" the transistors. For brevity, such tungsten interconnection structure are herein collectively referred to as "tungsten contacts."

Such tungsten contacts are usually formed using fluorine-based (F-based) chemical vapor deposition (CVD) techniques to overlay an active feature of the transistor, which is typically formed of silicon, with tungsten-based material (e.g., tungsten atoms). In general, the F-based CVD techniques inevitably induces fluoride atoms to attack the active feature formed of silicon. In this regard, one or more barrier layers formed of titanium (Ti)-based and/or tantalum (Ta)-based materials or alloys (e.g., Ti, Ta, TiN, TaN, and combinations thereof), serving as a fluoride barrier layer, are formed to cover the active feature prior to forming the tungsten contact.

As mentioned above, the interconnection structures, including the tungsten contacts, are scaled down in accordance with the Moore's Law. However, such fluoride barrier layers cannot be scaled down accordingly. Thus, existing tungsten contacts and the methods forming the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
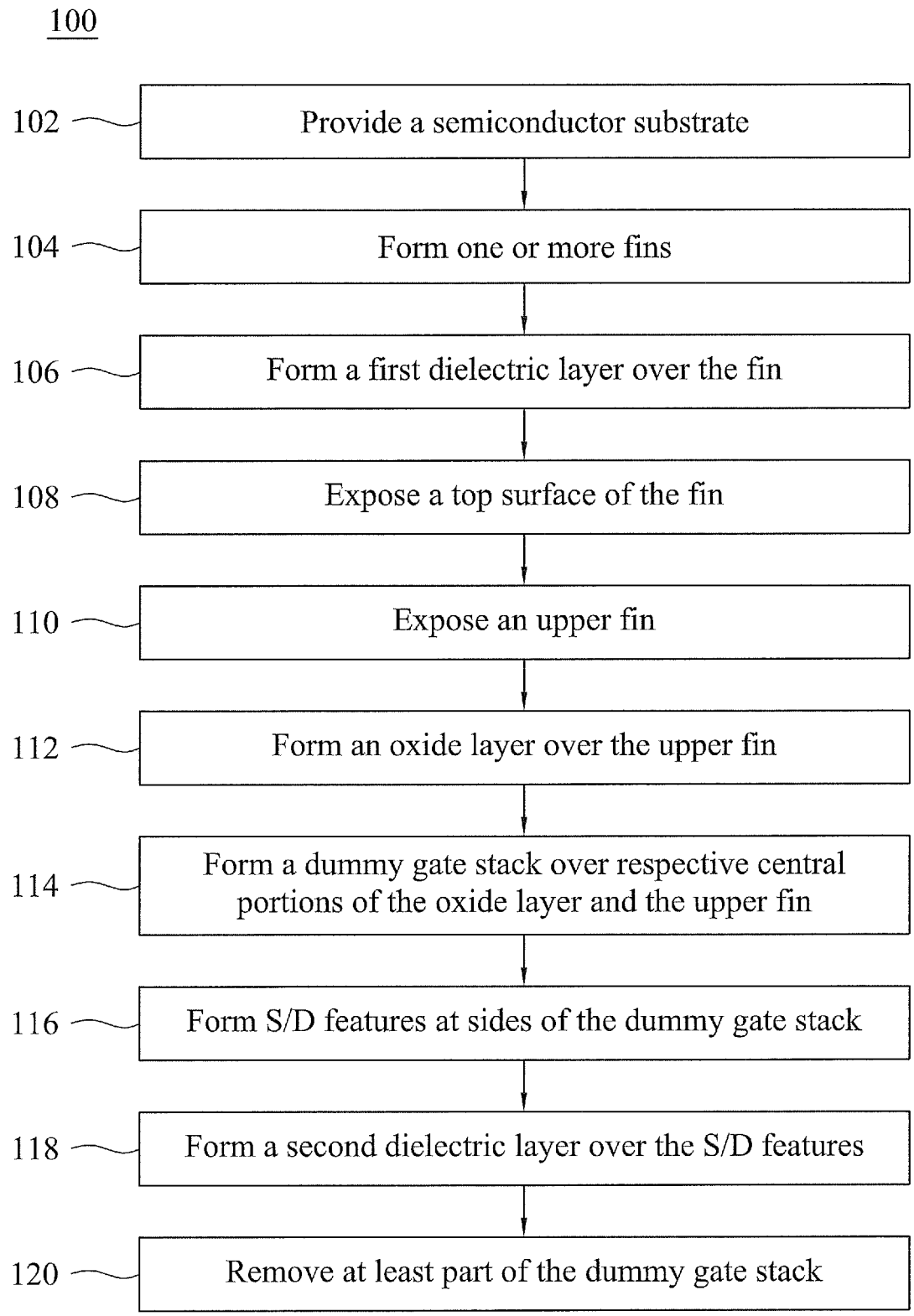
FIGS. 1A and 1B illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a contact structure immediately adjacent (e.g., coupled) to a conductive feature of a semiconductor device. In some embodiments, such a contact structure directly contacts, at least part of, the conductive feature of the semiconductor device (e.g., a gate feature, drain feature, or source feature of a metal-oxide-semiconductor field-effect-transistor (MOSFET)). In some embodiments, such a contact structure may be a tungsten contact. In some embodiments, the tungsten contact may be formed by a fluoride-free deposition technique, for example, a fluoride-free chemical vapor deposition (CVD) technique. As such, while forming the tungsten contact using the fluoride-free CVD technique to contact the conductive feature of the semiconductor device, the above-mentioned fluoride barrier layer is not needed, which may advantageously allow the tungsten contact to be scaled down more compactly with the corresponding conductive feature of the semiconductor device.

Figure 1B:
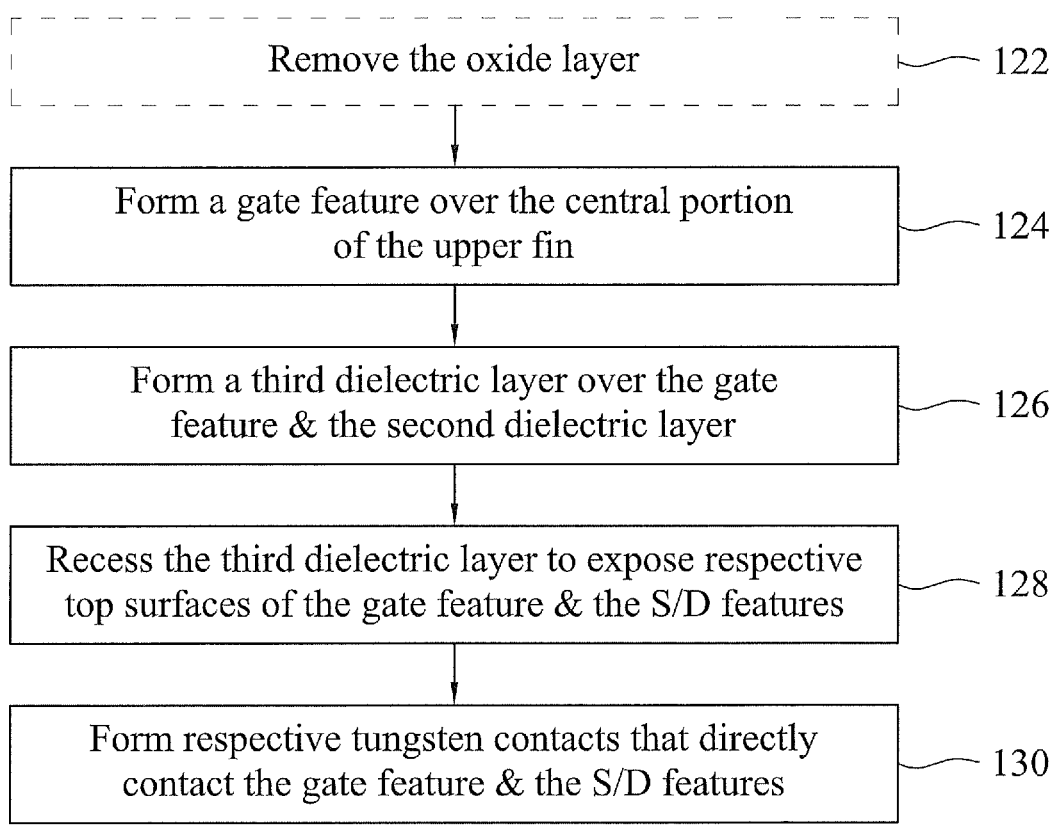

FIGS. 1A and 1B illustrate a flowchart of a method 100 to form a semiconductor device including one or more of the disclosed contact structures, according to one or more embodiments of the present disclosure. It is noted that the method 100 is merely an example, and is not intended to limit the present disclosure. In some embodiments, the semiconductor device may include a FinFET. As employed by the present disclosure, the FinFET refers to any fin-based, multi-gate transistor. It is noted that the method of FIGS. 1A-1B does not produce a completed FinFET or semiconductor device. A completed FinFET may be fabricated using complementary metal-oxide-semiconductor (CMOS) technology processing. Accordingly, it is understood that additional operations may be provided before, during, and after the method 100 of FIGS. 1A-1B, and that some other operations may only be briefly described herein.

In some embodiments, the method 100 starts with operation 102 in which a semiconductor substrate is provided. The method 100 continues to operation 104 in which one or more fins are formed extending beyond a major surface of the semiconductor substrate. The method 100 continues to operation 106 in which a first dielectric material is deposited over the semiconductor substrate to overlay the fin. The method 100 continues to operation 108 in which a top surface of the fin is exposed. The method 100 continues to operation 110 in which an upper fin of the fin is exposed. The method 100 continues to operation 112 in which an oxide layer is formed over the exposed upper fin. The method 100 continues to operation 114 in which a dummy gate stack is formed over respective central portions of the oxide layer and the upper fin. The method 100 continues to operation 116 in which source/drain (S/D) features are respectively formed at sides of the dummy gate stack. The method 100 continues to operation 118 in which a second dielectric layer is formed over the S/D features. The method 100 continues to operation 120 in which at least part of the dummy gate stack is removed. The method 100 continues to optional operation 122 in which the oxide layer is removed. The method 100 continues to operation 124 in which a gate feature is formed over the central portion of upper fin. The method 100 continues to operation 126 in which a third dielectric layer is formed over the gate feature and the second dielectric layer. The method 100 continues to operation 128 in which the third dielectric layer is recessed to expose respective top surfaces of the gate feature and the S/D features. The method 100 continues to operation 130 in which respective tungsten contacts are formed to directly contact the gate features and the S/D features.

In some embodiments, operations of the method 100 may be associated with perspective views of a semiconductor device 200 at various fabrication stages as shown in FIGS. 2A, 3A, 4A, 5A, 6A, 7A, 8A, 9A, 10A, 11A, 12A, 13A, 14A, and 15A, respectively, and corresponding cross-sectional views, taken along a first direction, as shown in FIGS. 2B, 3B, 4B, 5B, 6B, 7B, 8B, 9B, 10B, 11B, 12B, 13B, 14B, and 15B. Further, for purpose of clarity of illustration, with respect to the perspective views of the semiconductor device 200 at the fabrication stages as shown in FIGS. 14A and 15A, corresponding cross-sectional views of the semiconductor device 200, taken along a second direction, are shown in FIGS. 14C and 15C, respectively. In some embodiments, the semiconductor device 200 may be a FinFET. The FinFET 200 may be included in a microprocessor, memory cell, and/or other integrated circuit (IC). FIGS. 2A through 14B are simplified for a better understanding of the concepts of the present disclosure. For example, although the figures illustrate the FinFET 200, it is understood the IC may comprise a number of other devices comprising resistors, capacitors, inductors, fuses, etc., which are not shown in FIGS. 2A through 14B, for purposes of clarity of illustration.

Figure 2A:
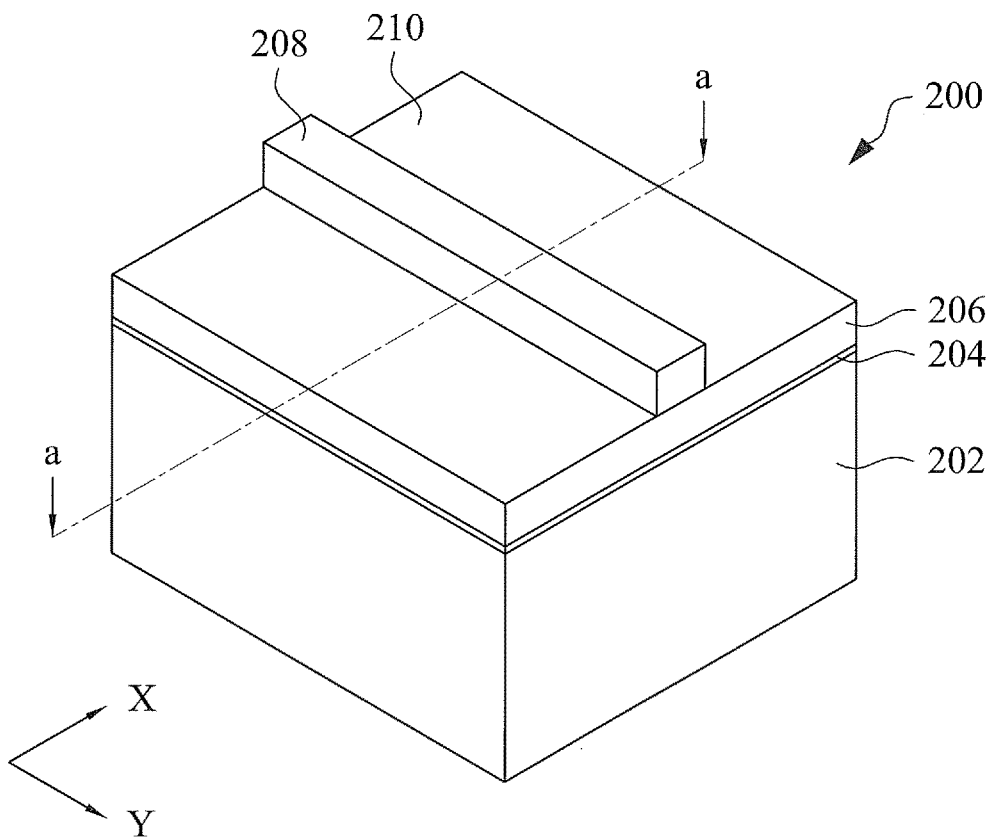
FIGS. 2A, 3A, 4A, 5A, 6A, 7A, 8A, 9A, 10A, 11A, 12A, 13A, 14A, and 15A illustrate perspective views of an exemplary semiconductor device, made by the method of FIGS. 1A-1B, during various fabrication stages, in accordance with some embodiments.
Figure 2B:
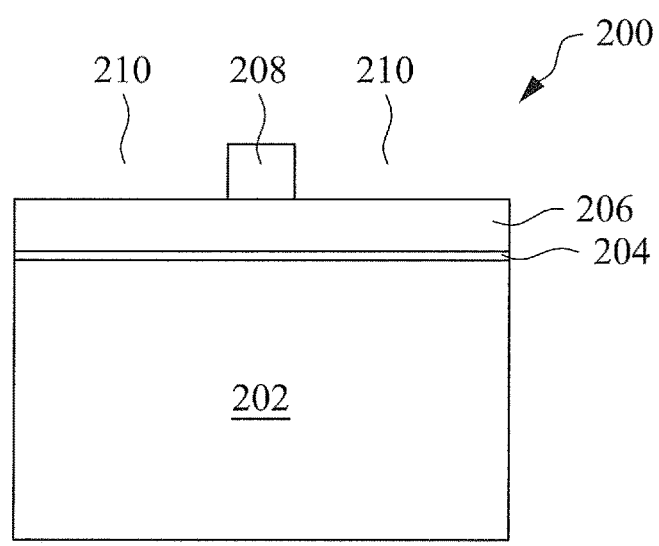
FIGS. 2B, 3B, 4B, 5B, 6B, 7B, 8B, 9B, 10B, 11B, 12B, 13B, 14B, and 15B illustrate corresponding cross-sectional views of FIGS. 2A, 3A, 4A, 5A, 6A, 7A, 8A, 9A, 10A, 11A, 12A, 13A, 14A, and 15A taken along a first direction, in accordance with some embodiments.

Corresponding to operation 102 of FIG. 1A, FIG. 2A is a perspective view of the FinFET 200 including a semiconductor substrate 202, which is provided at one of the various stages of fabrication, according to some embodiments, and FIG. 2B is a cross-sectional view of the FinFET 200 taken along line a-a (along the X direction) of FIG. 2A. As shown, the semiconductor substrate 202 is covered by a pad layer 204, a first mask layer 206, and a photo-sensitive layer 208 that is patterned with one or more openings 210. The photo-sensitive layer 208 is patterned to form one or more fins of the FinFET 200, which will be discussed in the following operations.

In some embodiments, the semiconductor substrate 202 comprises a crystalline silicon substrate (e.g., wafer). In some alternative embodiments, the semiconductor substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the semiconductor substrate 202 may include an epitaxial layer (epi-layer), may be strained for performance enhancement, and/or may include a silicon-on-insulator (SOI) structure.

In some embodiments, the pad layer 204 may be a thin film comprising silicon oxide formed, for example, using a thermal oxidation process. The pad layer 204 may act as an adhesion layer between the semiconductor substrate 202 and the first mask layer 206. The pad layer 204 may also act as an etch stop layer while etching the first mask layer 206. In some embodiments, the first mask layer 206 is formed of silicon nitride (SiN), silicon carbon nitride (SCN), silicon oxide nitride (SON), or the like, for example, using low-pressure chemical vapor deposition (LPCVD), plasma enhanced chemical vapor deposition (PECVD), or spin-on coating. The first mask layer 206 is used as a hard mask during subsequent photolithography processes. The photo-sensitive layer 208 is formed on the first mask layer 206, and then patterned thereby forming the openings 210 in the photo-sensitive layer 208.

Figure 3A:
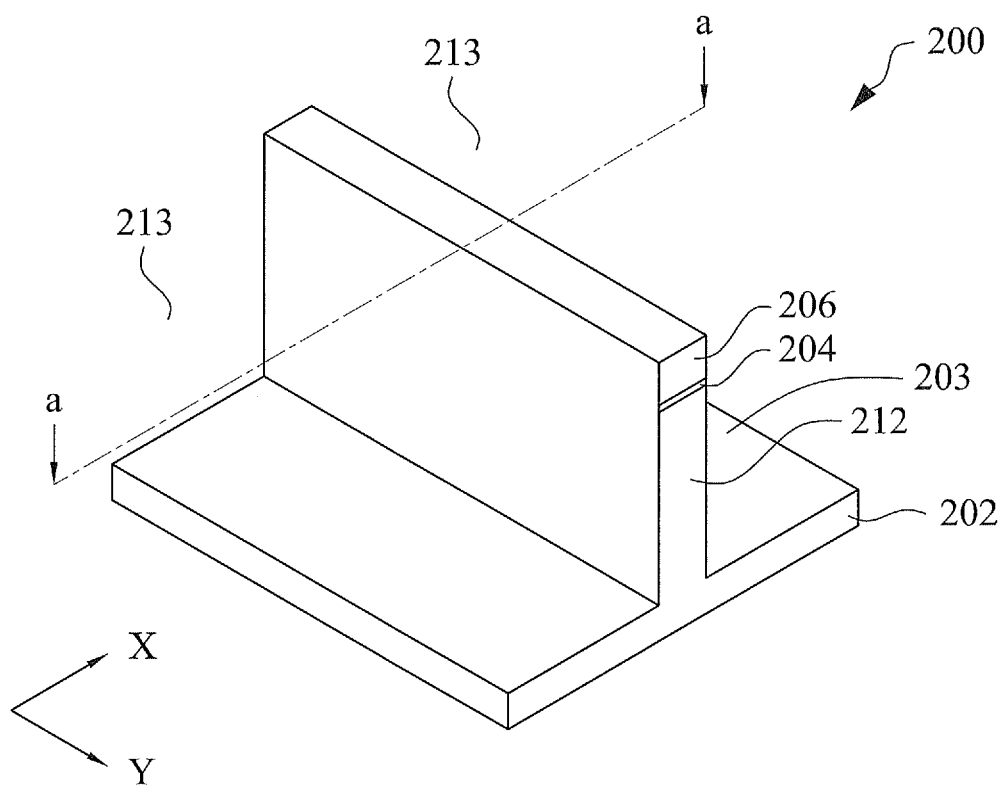
Figure 3B:
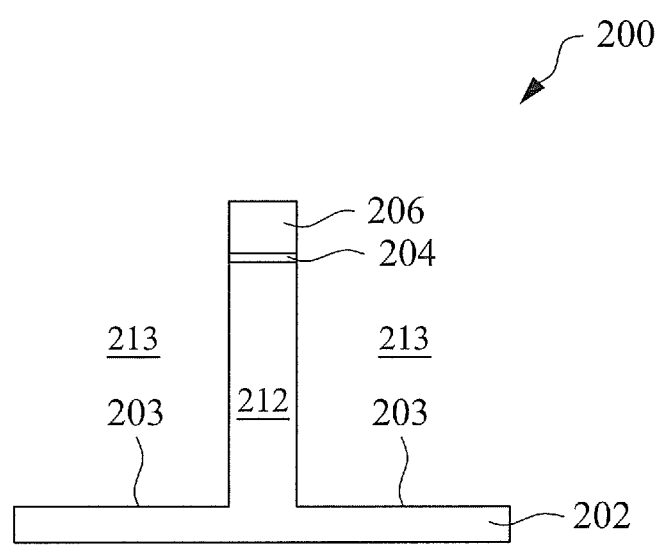

Corresponding to operation 104 of FIG. 1A, FIG. 3A is a perspective view of the FinFET 200 including a fin 212, which is formed at one of the various stages of fabrication, according to some embodiments, and FIG. 3B is a cross-sectional view of the FinFET 200 taken along line a-a (along the X direction) of FIG. 3A. It is noted that although only one fin 212 is shown in the illustrated embodiments of FIGS. 3A and 3B (and the following figures), any desired number of fins may be formed on the semiconductor substrate 202 using the photo-sensitive layer 208 (FIGS. 2A and 2B) with an according pattern.

In some embodiments, the fin 212 is formed by at least some of the following processes. The first mask layer 206 and pad layer 204 are etched through openings 210 (FIGS. 2A and 2B) to expose underlying semiconductor substrate 202. By using remaining pad layer 204 and the first mask layer 206, as shown in FIGS. 3A and 3B, the exposed semiconductor substrate 202 is then etched to form trenches 213 so as to cause a major surface 203 of the semiconductor substrate 202 to be exposed. A portion of the semiconductor substrate 202 sandwiched between the trenches 213 are thus formed as the fin 212. The fin 212 extends upward from the major surface 203. The trenches 213 may be strips (viewed from the top of the FinFET 200) parallel to each other, and closely spaced with respect to each other. After the fin 212 is formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DHF) acid, or the like.

Figure 4A:
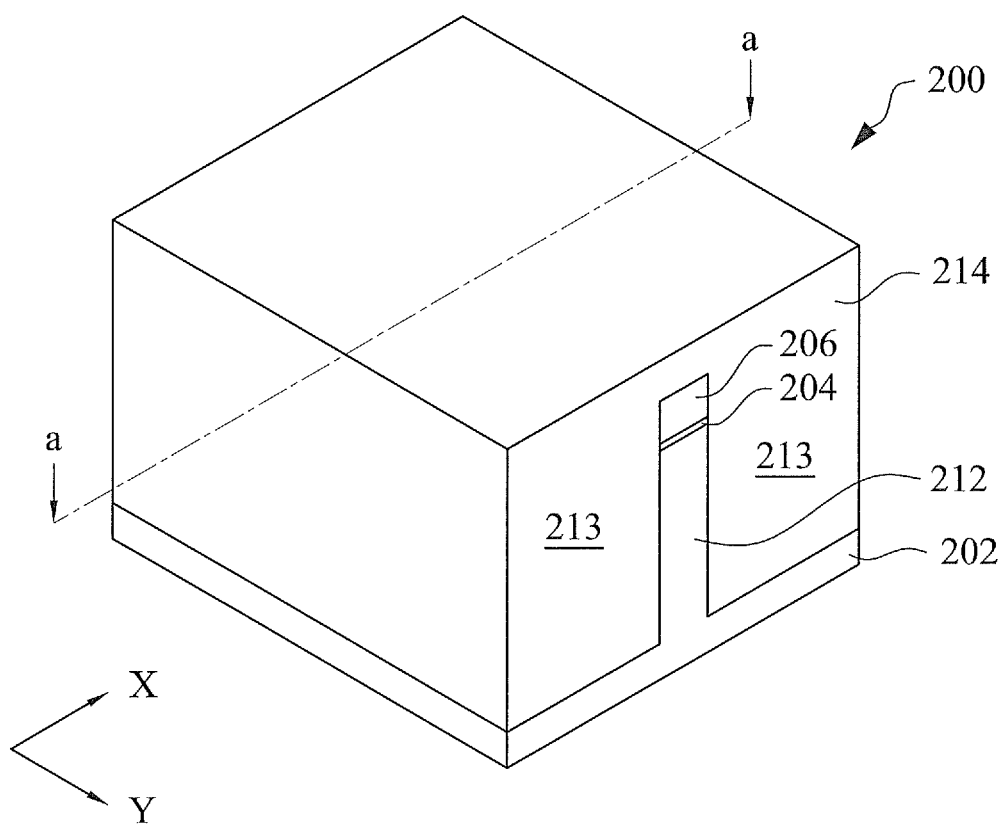
Figure 4B:
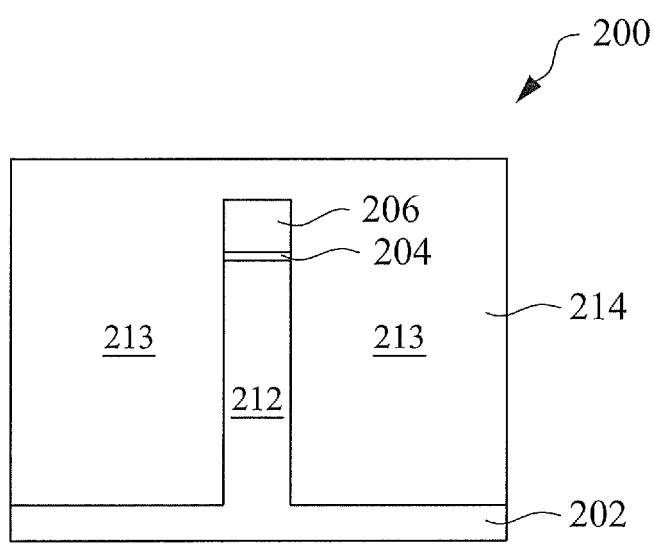

Corresponding to operation 106 of FIG. 1A, FIG. 4A is a perspective view of the FinFET 200 including a first dielectric layer 214, which is formed over the semiconductor substrate 202, the fin 212, the pad layer 204, and the first mask layer 206 at one of the various stages of fabrication, according to some embodiments, and FIG. 4B is a cross-sectional view of the FinFET 200 taken along line a-a (along the X direction) of FIG. 4A. As shown, the first dielectric layer 214 is formed over the whole FinFET 200 such that the entire trenches 213 are filled by the material of the first dielectric layer 214, for example, silicon oxide.

In an embodiment, the first dielectric layer 214 may be deposited over the substrate 202 using a high-density-plasma (HDP) CVD process with reacting precursors, e.g., silane ($SiH_4$) and oxygen ($O_2$). In another embodiment, the first dielectric layer 214 may be deposited over the substrate 202 using a sub-atmospheric CVD (SACVD) process or a high aspect-ratio process (HARP), wherein process gases used in such processes may comprise tetraethylorthosilicate (TEOS) and ozone ($O_3$). In yet another embodiment, the first dielectric layer 214 may be deposited over the substrate 202 using a spin-on-dielectric (SOD) process such as, for example, hydrogen silsesquioxane (HSQ), methyl silsesquioxane (MSQ), or the like.

Figure 5A:
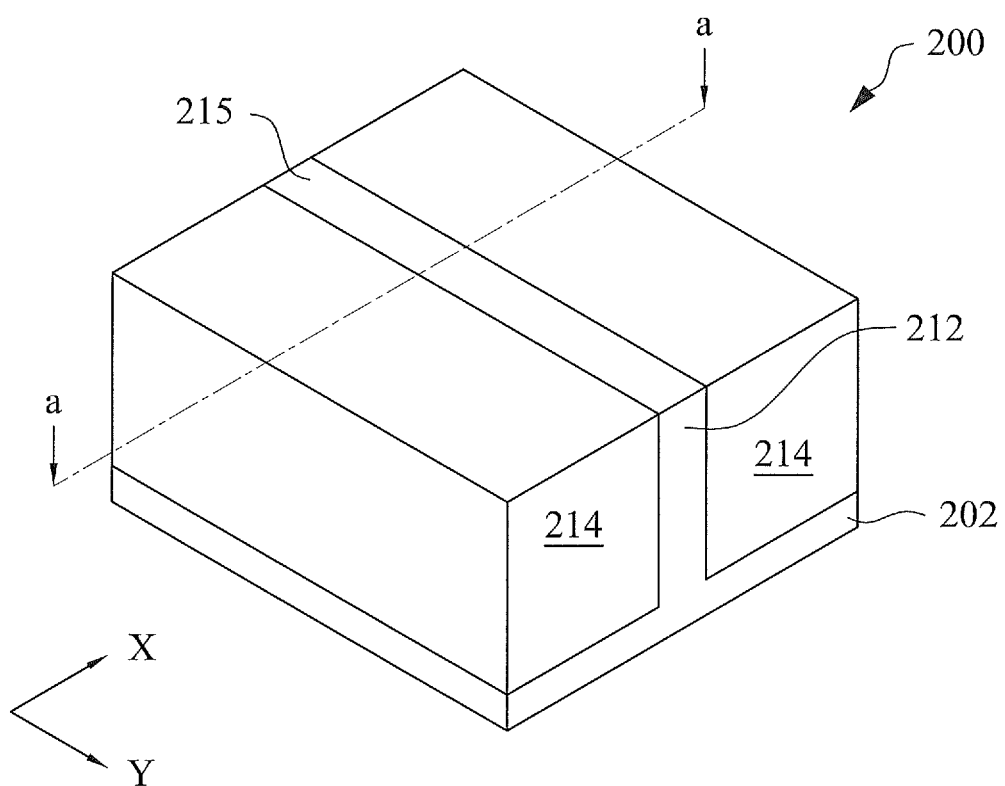
Figure 5B:
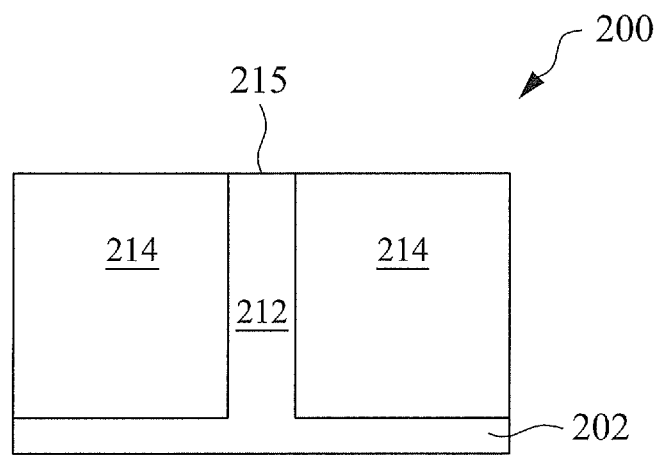

Corresponding to operation 108 of FIG. 1A, FIG. 5A is a perspective view of the FinFET 200 including a top surface 215 of the fin 212 being exposed at one of the various stages of fabrication, according to some embodiments, and FIG. 5B is a cross-sectional view of the FinFET 200 taken along line a-a (along the X direction) of FIG. 5A. In some embodiments, the top surface 215 is exposed by performing a polishing process (e.g., a chemical-mechanical polishing process) on the dielectric layer 214 (FIGS. 4A and 4B) until the first mask layer 206 is again exposed. The first mask layer 206 and the pad layer 204 are then removed to expose the top surface 215.

In some embodiments, when the first mask layer 206 is formed of silicon nitride, the first mask layer 206 may be removed using a wet process using hot phosphoric acid ($H_3PO_4$), and when the pad layer 204 is formed of silicon oxide, the pad layer 204 may be removed using diluted hydrofluoric acid (HF). In some alternative embodiments, the removal of the first mask layer 206 and the pad layer 204 may be performed after a recession process performed on the dielectric layer 214, which will be discussed in FIGS. 6A and 6B as follows.

Figure 6A:
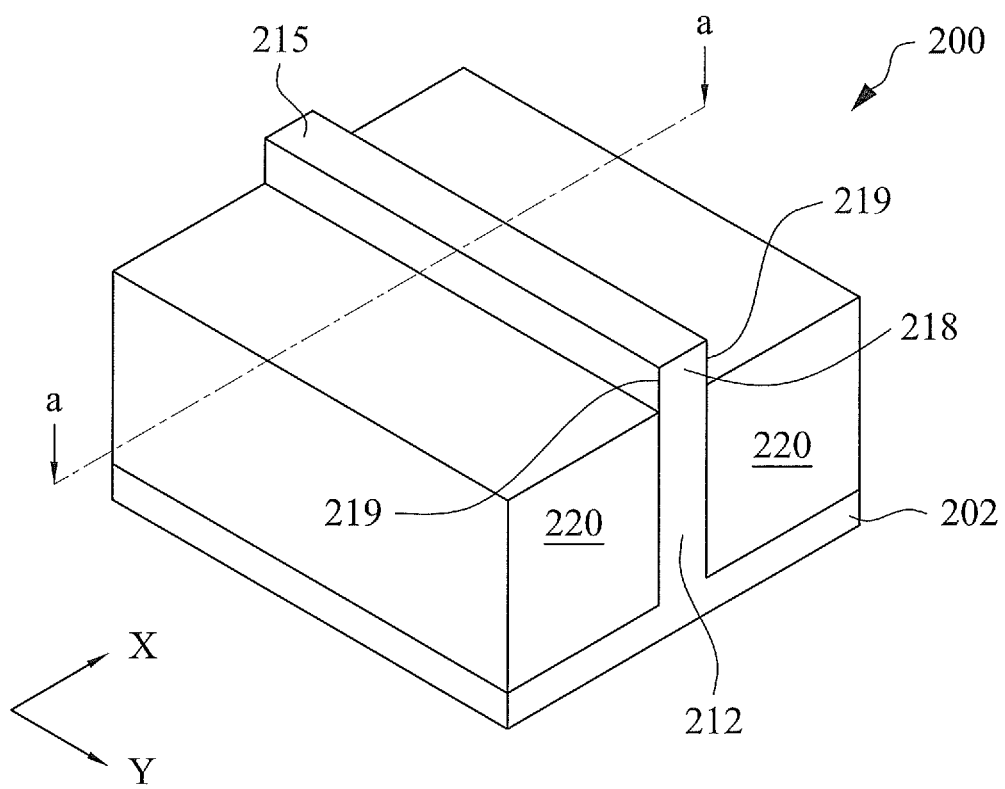
Figure 6B:
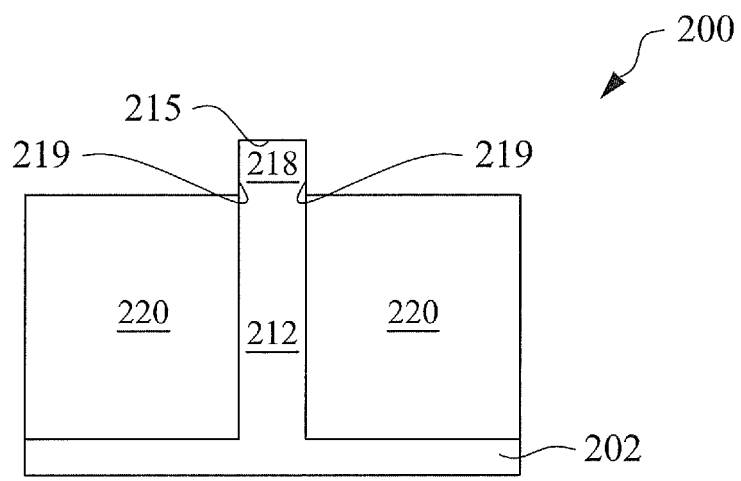

Corresponding to operation 110 of FIG. 1A, FIG. 6A is a perspective view of the FinFET 200 including an upper fin 218 of the fin 212 being exposed at one of the various stages of fabrication, according to some embodiments, and FIG. 6B is a cross-sectional view of the FinFET 200 taken along line a-a (along the X direction) of FIG. 6A. As shown, isolation features 220 are respectively formed at a lower portion of the fin 212 so as to expose the upper fin 218. In some embodiments, after the upper fin 218 is exposed, sidewalls 219 of the upper fin 218 are exposed together with the respective top surface 215.

In some embodiments, the isolation feature 220 may be formed by performing at least one etching process to recess an upper portion of the dielectric layer 214 (FIGS. 5A and 5B). In an embodiment, the etching process may include performing a wet etching process such as, for example, dipping the substrate 202 in a hydrofluoric acid (HF) solution to recess the upper portion of the dielectric layer 214 until the upper fin 218 is exposed. In another embodiment, the etching process may include performing a dry etching process such as, for example, using etching gases fluoroform ($CHF_3$) and/or boron trifluoride ($BF_3$) to recess the upper portion of the dielectric layer 214 until the upper fin 218 is exposed. In some embodiments, the isolation feature 220 may be referred to as a shallow trench isolation (STI).

Figure 7A:
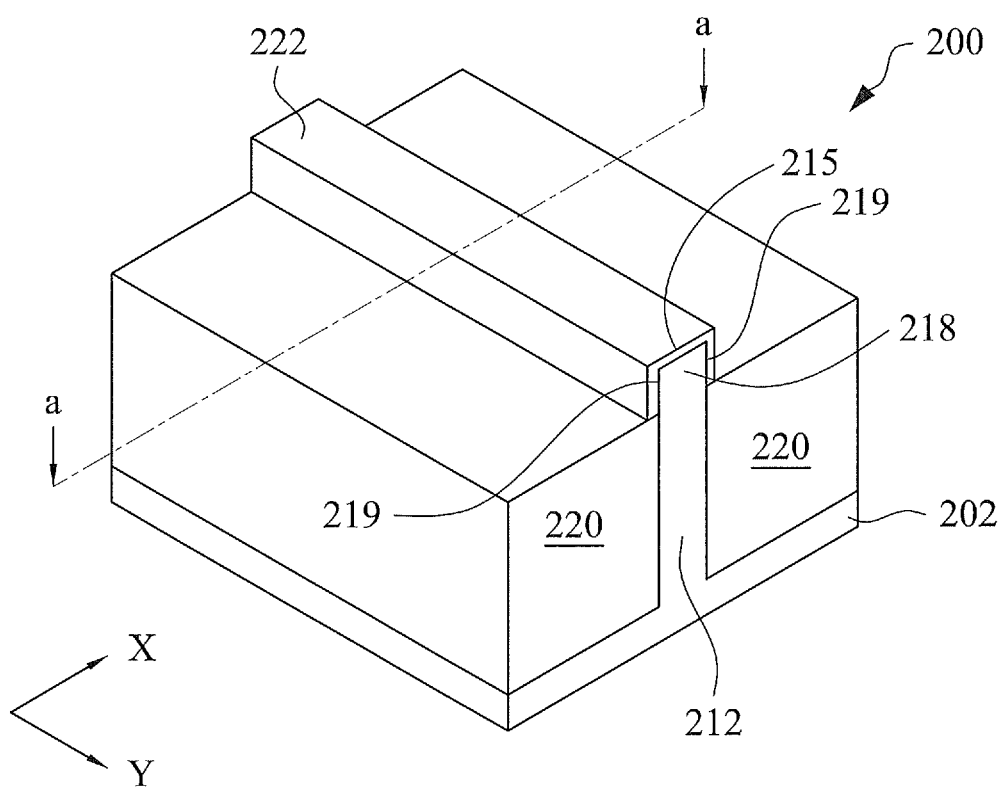
Figure 7B:
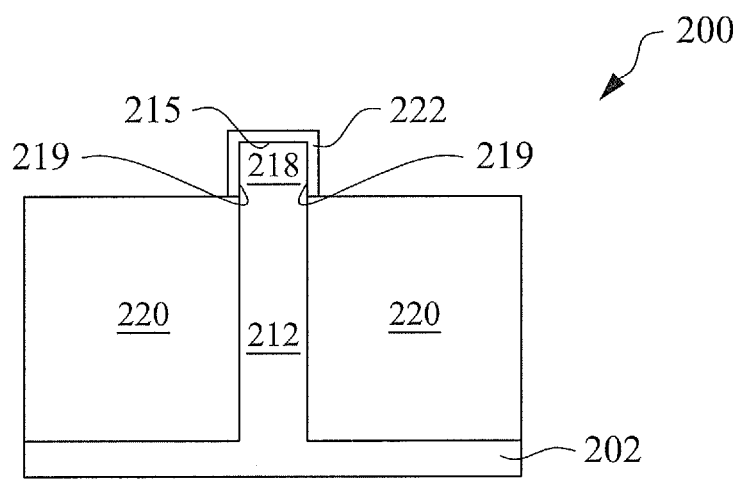

Corresponding to operation 112 of FIG. 1A, FIG. 7A is a perspective view of the FinFET 200 including an oxide layer 222 overlaying the upper fin 218, which is formed at one of the various stages of fabrication, according to some embodiments, and FIG. 7B is a cross-sectional view of the FinFET 200 taken along line a-a (along the X direction) of FIG. 7A. As shown, the oxide layer 222 is formed to extend along the sidewalls 219 and overlay the top surface 215 of the upper fin 218. In some embodiments, the oxide layer 220 may be formed by using a thermal oxidation process, an atomic layer deposition (ALD) process, a chemical vapor deposition (CVD) process, or the like. In the embodiments in which the upper fin 218 is formed of silicon, the oxide layer 220 may include silicon oxide. In some embodiments, the oxide layer 222 has a substantially thin thickness (e.g., 1 nanometers (nm) to 5 nm), which may be removed in a subsequent operation when the FinFET 200 is intended to being used for a certain application, e.g., a core device.

Figure 8A:
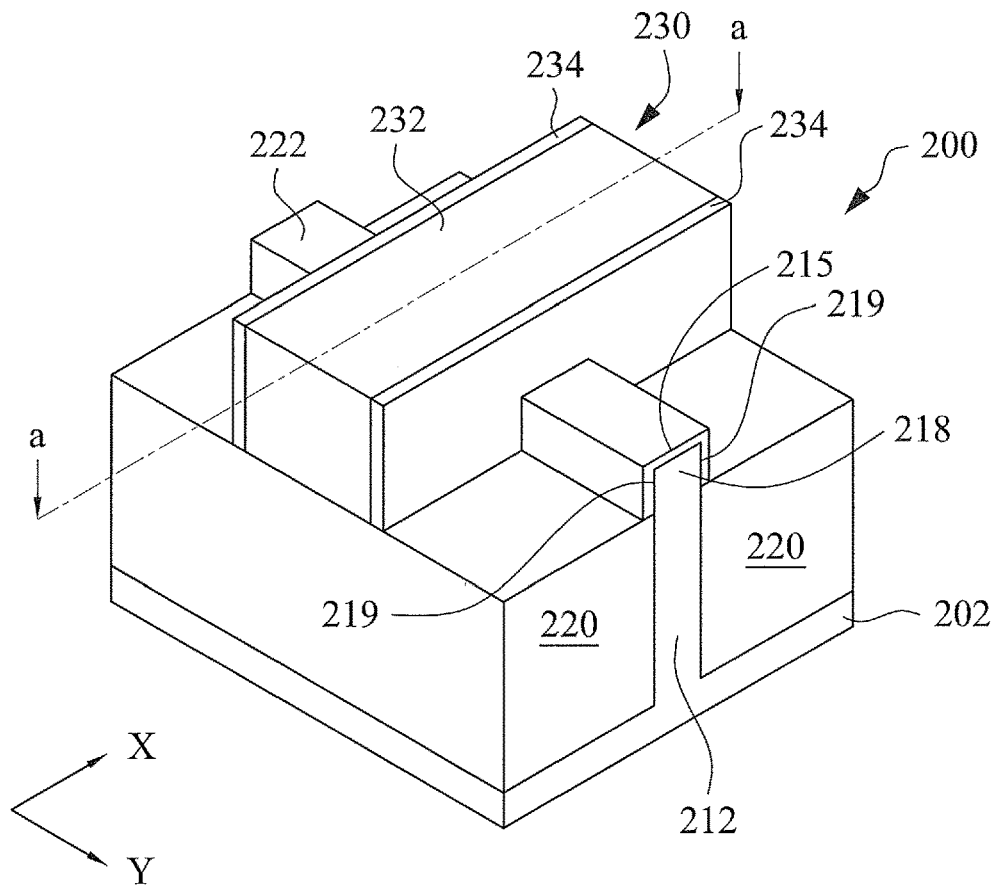
Figure 8B:
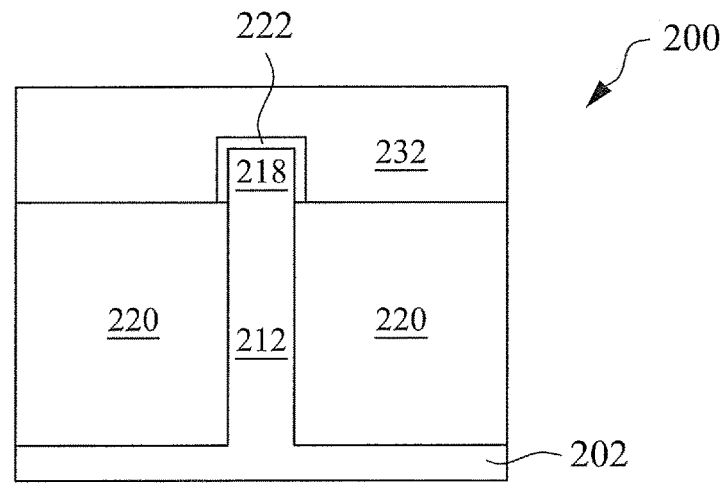

Corresponding to operation 114 of FIG. 1A, FIG. 8A is a perspective view of the FinFET 200 including a dummy gate stack 230, which is formed at one of the various stages of fabrication, according to some embodiments, and FIG. 8B is a cross-sectional view of the FinFET 200 taken along line a-a of FIG. 8A. As shown, the dummy gate stack 230 is formed to overlay a central portion of the upper fin 218 with a corresponding central portion of the oxide layer 222 being sandwiched therebetween.

In some embodiments, the central portion of the upper fin 218, overlaid by the dummy gate stack 230, may serve as a conduction channel (along the Y direction) of the FinFET 200, and the central portions of the oxide layer 222 and an optional protection layer (not shown) disposed between such the conduction channel and the dummy gate stack 230 may together serve as the gate dielectric layer of the FinFET 200. In some alternative embodiments, the central portions of the oxide layer 222 and the protection layer may be replaced by a high-k dielectric layer, which is used to serve as the gate dielectric layer of the FinFET 200.

The dummy gate stack 230 includes a dummy gate electrode 232, which will be removed in a later removal process, and spacer layers 234 extending along sidewalls of the dummy gate electrode 232. In some embodiments, the dummy gate electrode 232 may comprise a polysilicon material. Further, the dummy gate electrode 232 may be a polysilicon material doped with a uniform or non-uniform doping concentration. The dummy gate electrode 232 may be formed using a suitable process such as ALD, CVD, physical vapor deposition (PVD), plating, or combinations thereof.

In some embodiments, the spacer layer 234 may include silicon oxide (SiO), silicon nitride (SiN), silicon oxynitride (SiON), or other suitable material. The spacer layer 234 may comprise a single layer or multilayer structure. In some embodiments, the spacer layer 234 may be formed by depositing a blanket layer of the spacer layer 234 by CVD, PVD, ALD, or other suitable technique, and performing an anisotropic etching process on the blanket layer to form the pair of the spacer layer 234 along the sidewalls of the gate electrode 232, as shown in the illustrated embodiment of FIG. 8A.

Figure 9A:
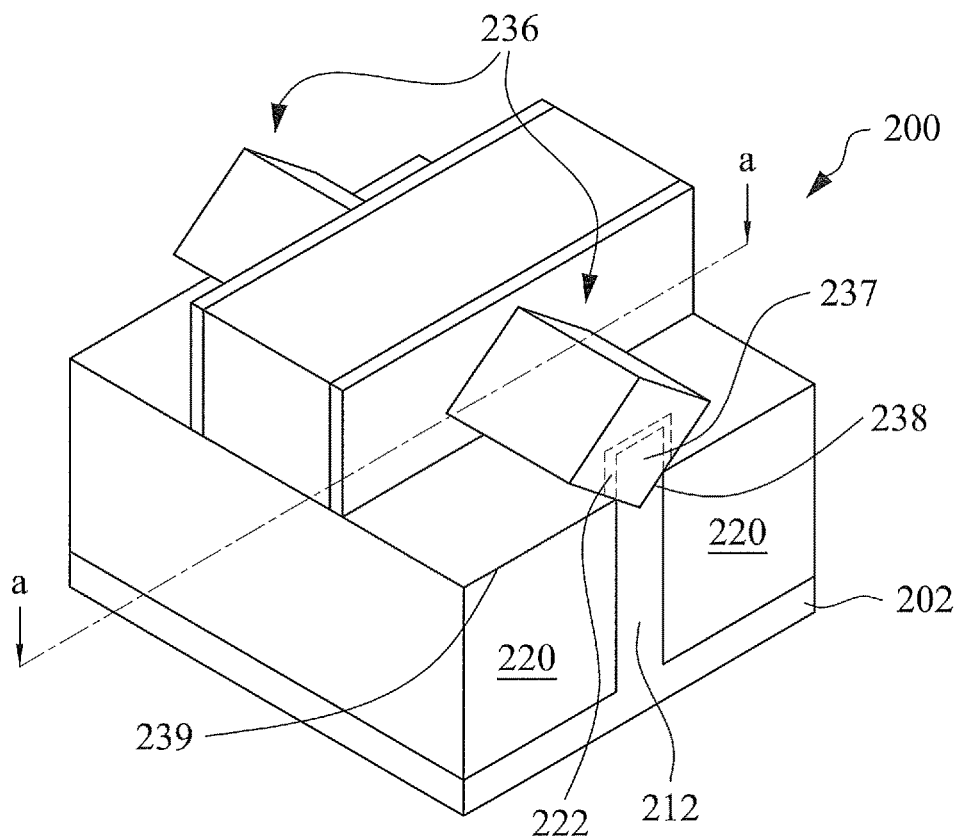
Figure 9B:
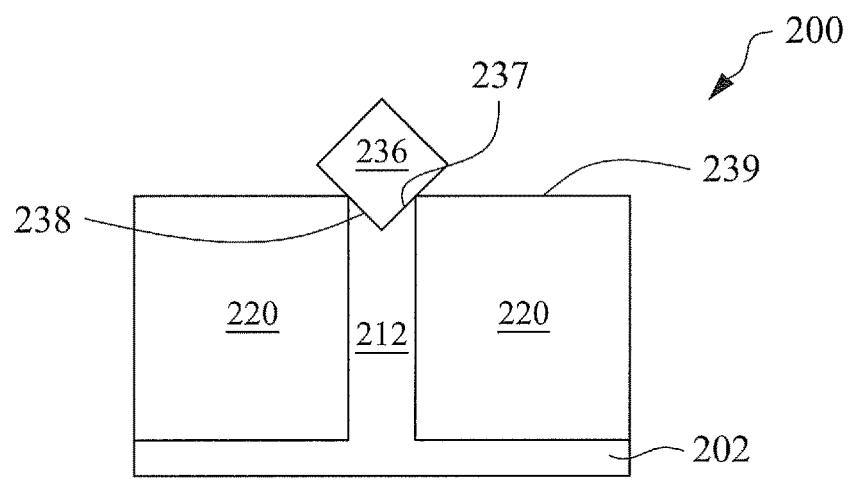

Corresponding to operation 116 of FIG. 1A, FIG. 9A is a perspective view of the FinFET 200 including source/drain (S/D) features 236, which are formed on side portions of the fin 212 that are not covered by the dummy gate stack 230 at one of the various stages of fabrication, according to some embodiments, and FIG. 9B is a cross-sectional view of the FinFET 200 taken along line a-a of FIG. 9A. It is noted the line a-a of FIG. 9A is not taken across the dummy gate stack 230, but across the S/D features 236. In some embodiments, the respective side portions of the oxide layer 222, and at least part of the upper fin 218 are removed before the formation of the S/D features 236, so that the removed side portions of the oxide layer 220, and the upper fin 218 are shown in dotted lines, respectively, in FIG. 9A. The formation of the S/D feature 236 will be briefly described as follows.

In some embodiments, the side portions of the oxide layer 220 not covered by the gate stack 230 are removed by one or more selective wet/dry etching processes, and the side portions of the upper fin 218 are removed by one or more other selective wet/dry etching processes so as to form respective recesses 237 on the sides of the dummy gate stack 230. In some embodiments, each recess 237 has a bottom surface 238. Such a recess 237 may be extended downwardly beneath a top surface 239 of the isolation feature 220, i.e., the bottom surface 238 is vertically lower than the top surface 239. Subsequently, the S/D features 236 are epitaxially grown from the fin 212 by using a low-pressure chemical vapor deposition (LPCVD) process and/or a metal-organic chemical vapor deposition (MOCVD) process.

Figure 10A:
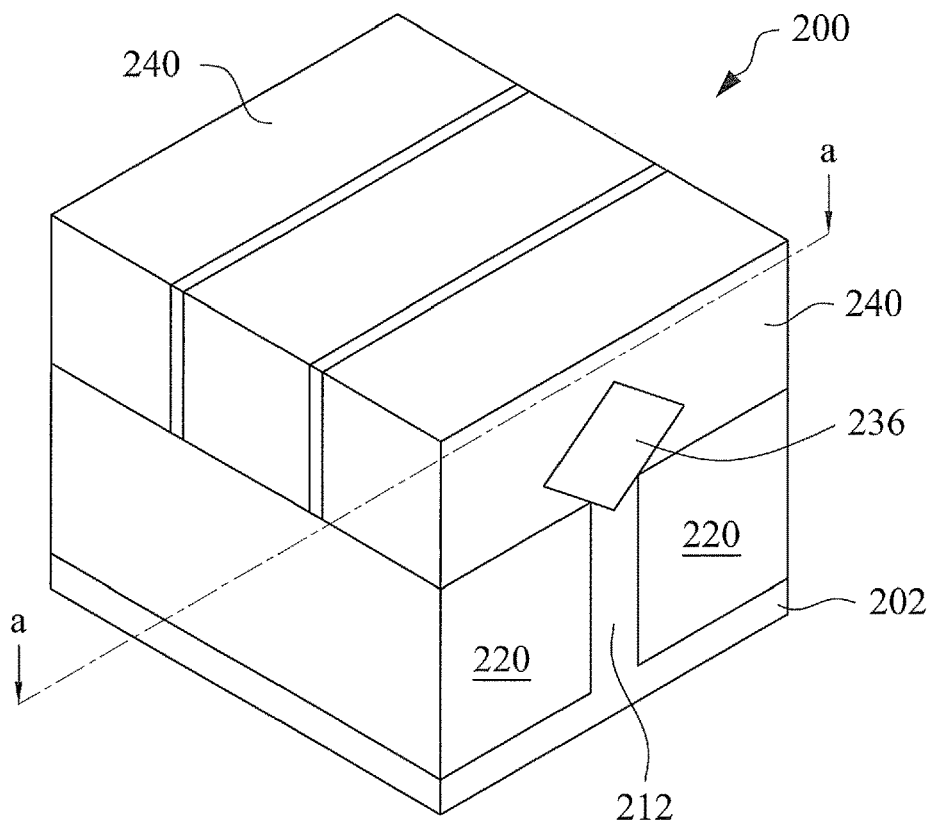
Figure 10B:
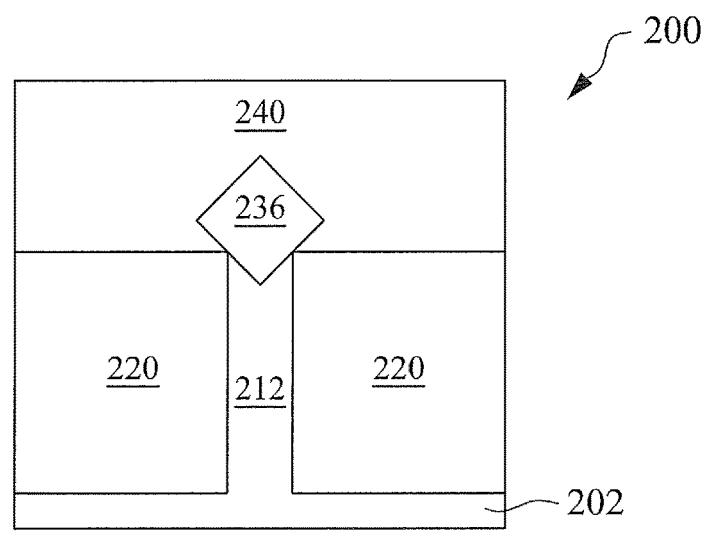

Corresponding to operation 118 of FIG. 1A, FIG. 10A is a perspective view of the FinFET 200 including a second dielectric layer 240, which is formed to overlay the S/D feature 236 at one of the various stages of fabrication, according to some embodiments, and FIG. 10B is a cross-sectional view of the FinFET 200 taken along line a-a of FIG. 10A. It is noted the line a-a of FIG. 10A is not taken across the dummy gate stack 230, but across the S/D features 236.

According to some embodiments, the second dielectric layer 240 is formed to overlay the S/D feature 236 so as to protect the S/D features 236 during a subsequent process, e.g., removing the dummy gate stack 230, which will be discussed below. Such a second dielectric layer 240 may include a material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 11A:
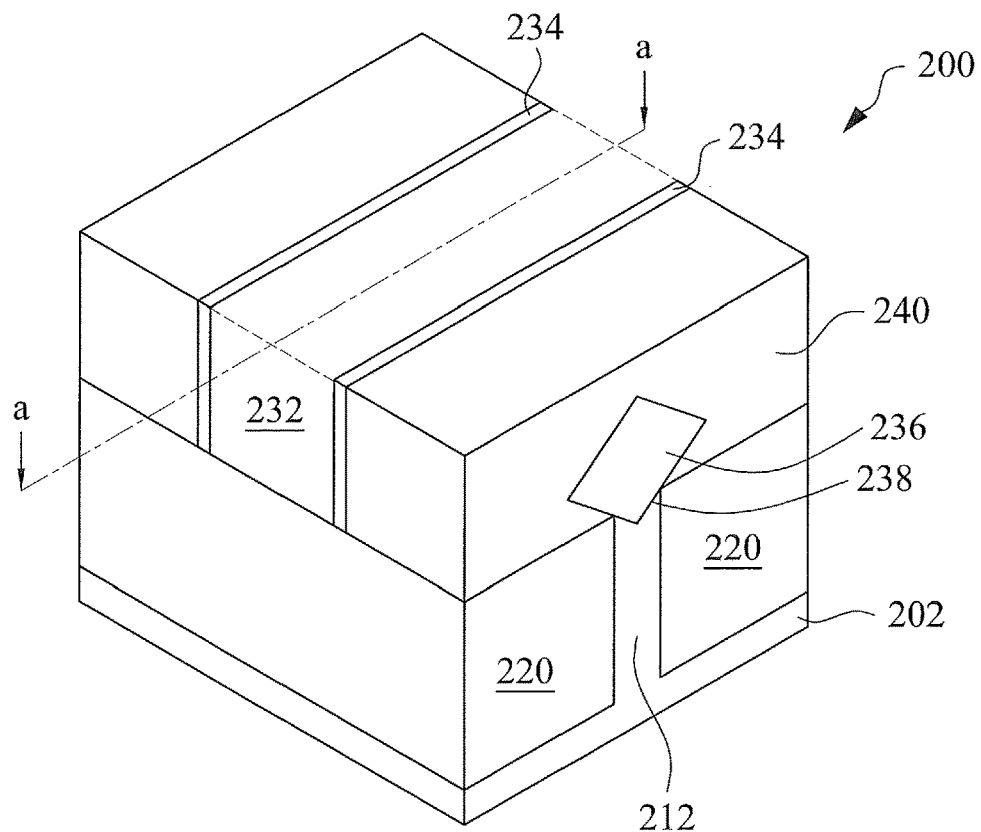
Figure 11B:
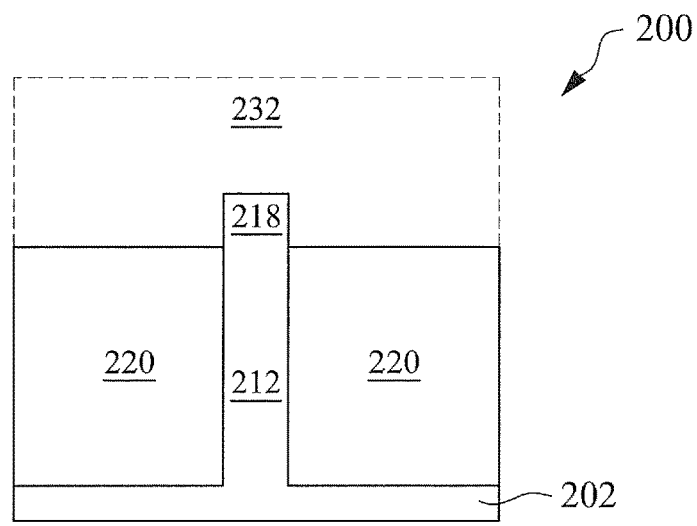

Corresponding to operation 120 of FIG. 1A, FIG. 11A is a perspective view of the FinFET 200 in which the dummy gate electrode 232 is removed at one of the various stages of fabrication, according to some embodiments, and FIG. 11B is a cross-sectional view of the FinFET 200 taken along line a-a of FIG. 11A. For purposes of illustration, the removed dummy gate electrode 232 is shown in dotted line. As better seen in the cross-sectional view of the FinFET 200 of FIG. 11B, after the dummy gate electrode 232 is removed, and the oxide layer 222 is optionally removed, the central portion of the upper fin 218 (that was overlaid by the dummy gate electrode 232) is exposed.

In some embodiments, concurrently with or subsequently to the dummy gate electrode 232 being removed, the spacer layer 234 may remain intact. In the example in which the dummy gate electrode 232 includes a polysilicon material, the dummy gate electrode 232 may be removed (etched) by one or more selective dry and/or wet etching processes until the central portion of the optional protection layer covered by the dummy gate electrode 232 is exposed. More specifically, in some embodiments, the wet etching process includes using diluted hydrofluoric acid (DHF), and/or an amine derivative etchant (e.g., $NH_4OH$, $NH_3(CH_3)OH$, TetraMethyl Ammonium Hydroxide (TMAH), etc.); and the dry etching process includes using a plasma of reactive gas that is selected from:
fluorocarbons, oxygen, chlorine, boron trichloride, nitrogen, argon, helium, or a combination thereof.

As described above, the oxide layer 222 may be optionally removed. In the illustrated embodiment of FIGS. 11A and 11B (and the following figures), after the dummy gate electrode 232 is removed, the oxide layer 222 is subsequently removed by one or more selective wet etching processes until the central portion of the upper fin 218 that was covered by the dummy gate electrode 232 and the oxide layer 222 is exposed. More specifically, in some embodiments, the wet etching process to remove the oxide layer 222 includes using diluted hydrofluoric acid (DHF), and/or an amine derivative etchant (e.g., $NH_4OH$, $NH_3(CH_3)OH$, TetraMethyl Ammonium Hydroxide (TMAH), etc.

Figure 12A:
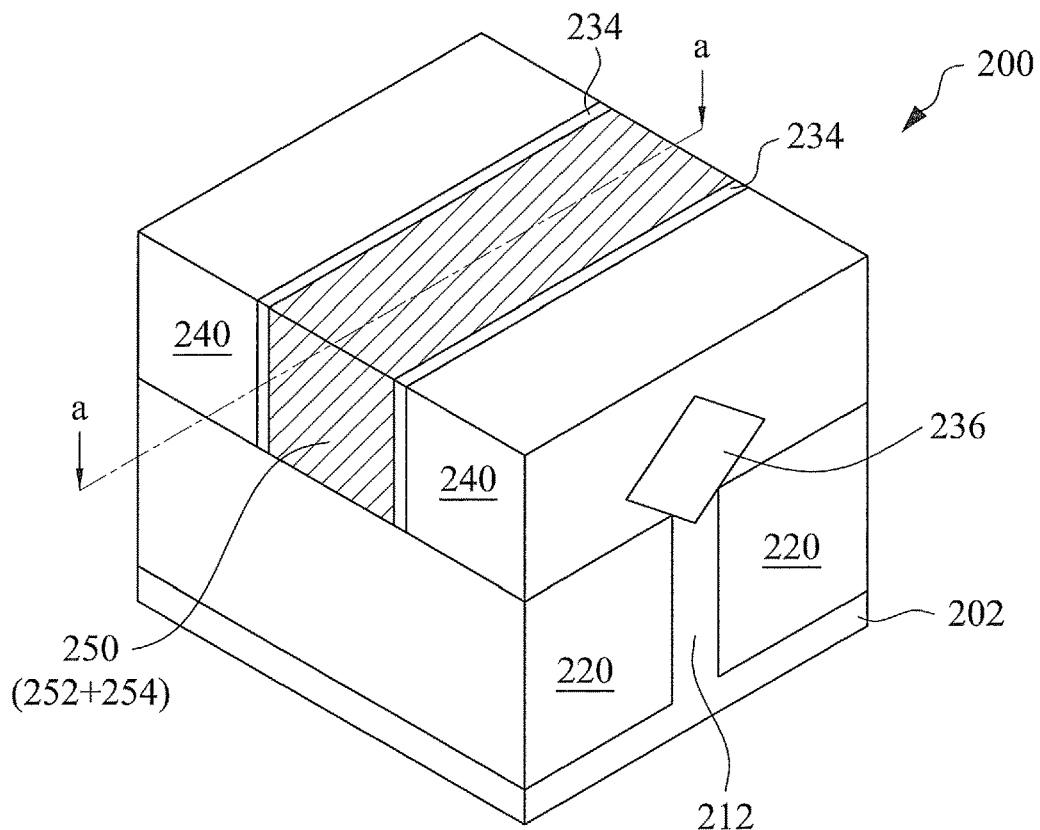
Figure 12B:
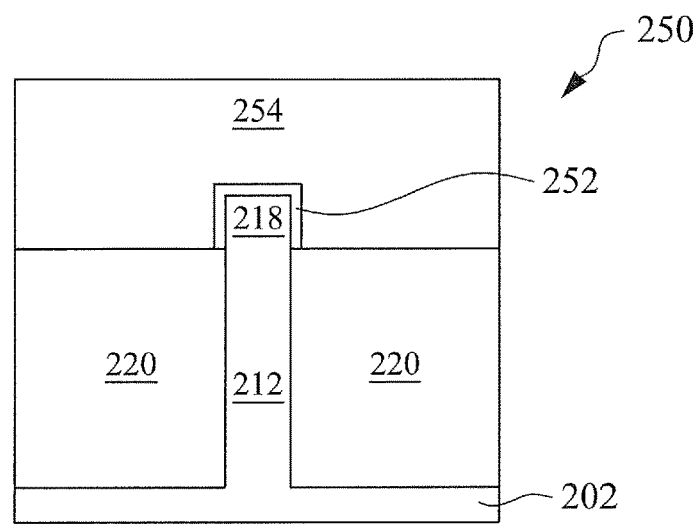

Corresponding to operation 124 of FIG. 1B, FIG. 12A is a perspective view of the FinFET 200 including a gate feature 250, which is formed at one of the various stages of fabrication, according to some embodiments, and FIG. 12B is a cross-sectional view of the FinFET 200 taken along line a-a of FIG. 12A. In some embodiments, the gate feature 250, including a gate dielectric layer 252 and a conductive gate electrode 254, overlays the central portion of the upper fin 218.

In some embodiments, the gate dielectric layer 252 may include a high-k dielectric material. Such a high-k dielectric material includes oxides of Li, Be, Mg, Ca, Sr, Se, Y, Zr, Hf, Al, La, Ce, Pr, Nd, Sm, Eu, Gd, Tb, Dy, Ho, Er, Tm, Yb, Lu and mixtures thereof. In some embodiments, the high-k dielectric material is deposited to overlay the central portion of the upper fin 218 by CVD, PVD, ALD, or the like.

In some embodiments, the conductive gate electrode 254 may include a metal material such as, for example, Al, Cu, W, Ti, Ta, TiN, TiAl, TiAlN, TaN, NiSi, CoSi, or combinations thereof. In some alternative embodiments, the conductive gate electrode 254 may include a polysilicon material, wherein the polysilicon material may be doped with a uniform or non-uniform doping concentration. The conductive gate electrode 254 may be formed using a suitable process such as ALD, CVD, PVD, plating, or combinations thereof. Although the conductive gate electrode 254 is shown as a single layer in the illustrated embodiments of FIGS. 12A and 12B, it is understood that the conductive gate electrode 254 may include plural above-described metal materials stacked on top to one another.

Figure 13A:
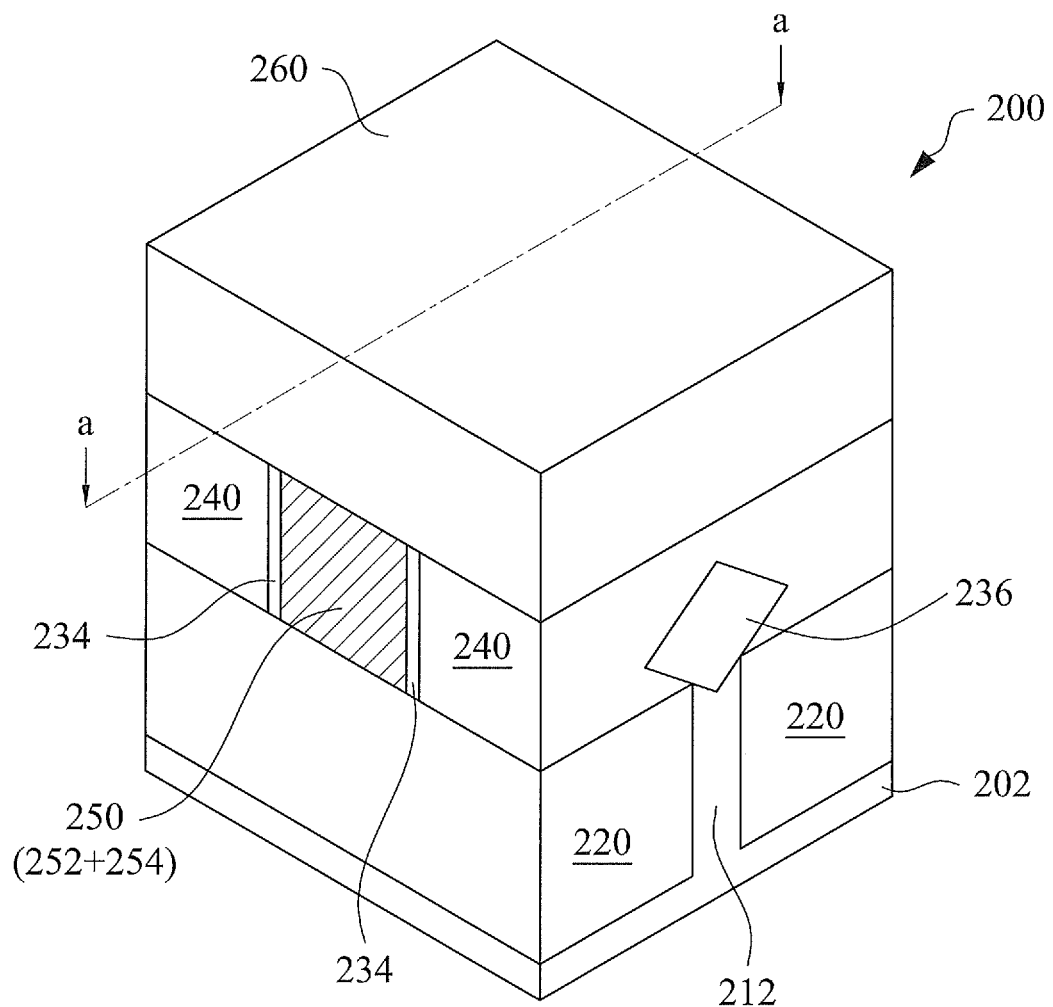
Figure 13B:
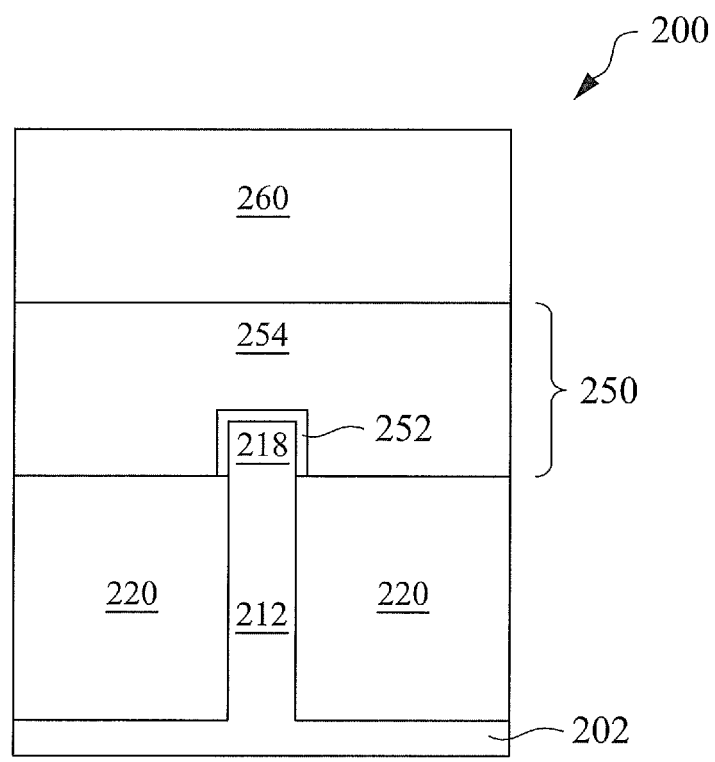
Figure 14A:
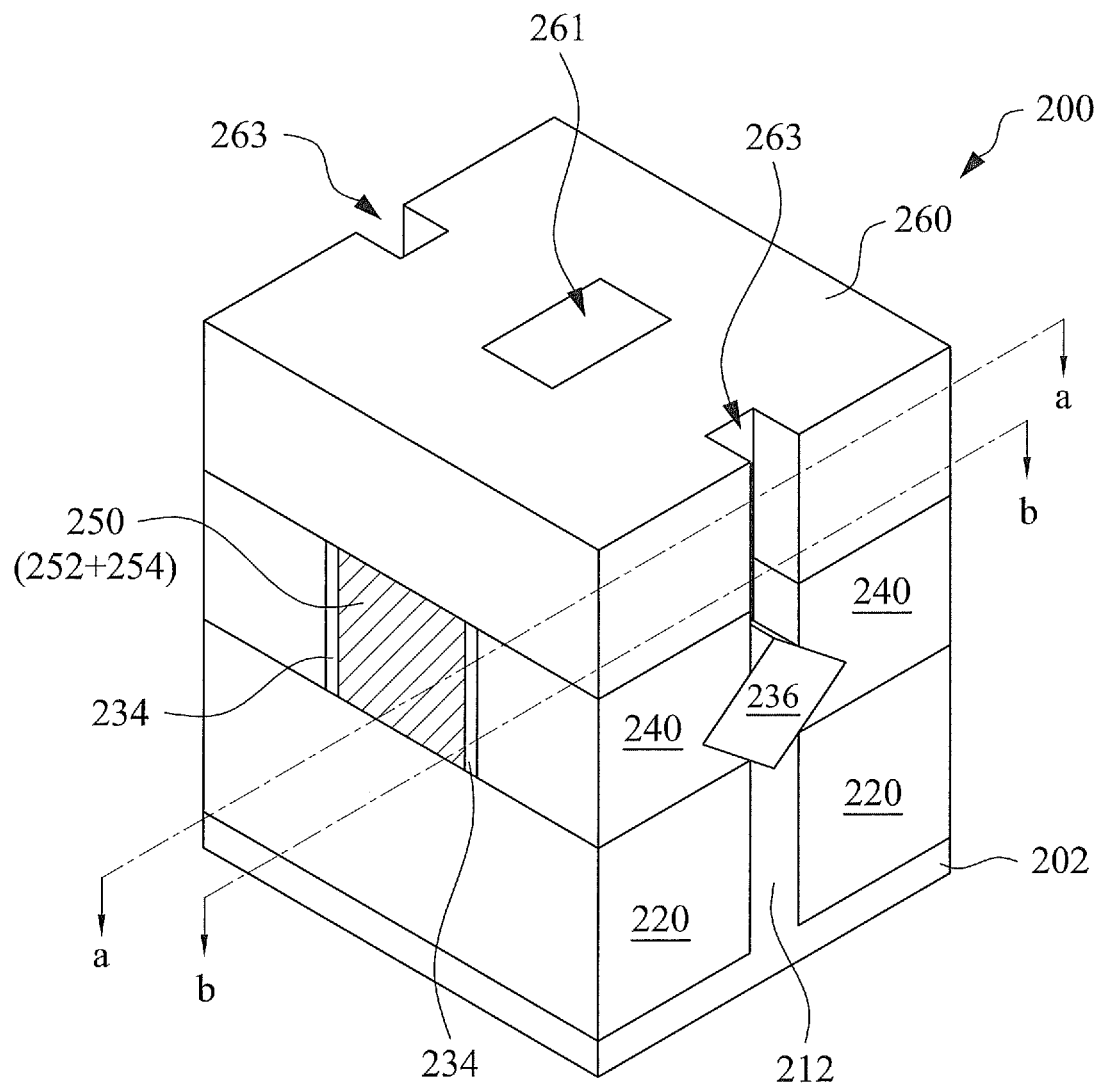

Corresponding to operation 126 of FIG. 1B, FIG. 13A is a perspective view of the FinFET 200 including a third dielectric layer 260 overlaying the gate stack 250 and the second dielectric layer 240, which is formed at one of the various stages of fabrication, according to some embodiments, and FIG. 13B is a cross-sectional view of the FinFET 200 taken along line a-a of FIG. 13A. In some embodiments, the third dielectric layer 260 may be referred to as an inter-layer dielectric (ILD) layer.

According to some embodiments, the third dielectric layer 260 is formed to be partially recessed so as to re-expose respective top surface of the S/D features 236 and the gate electrode 254, which will be discussed below. In some embodiments, such a third dielectric layer 260 may be formed of a material substantially similar to the material of the second dielectric layer 240. For example, the third dielectric layer 260 may include a material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 14B:
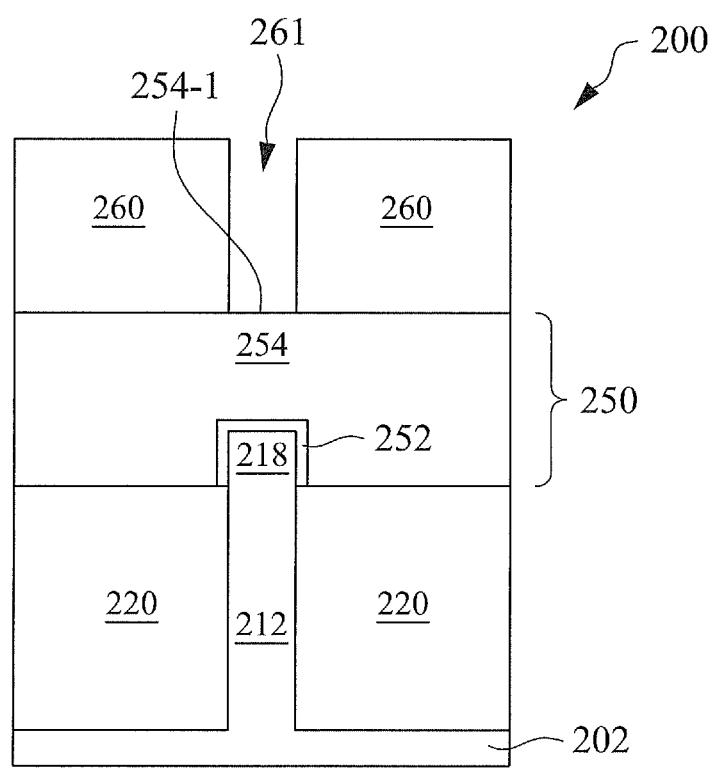
Figure 14C:
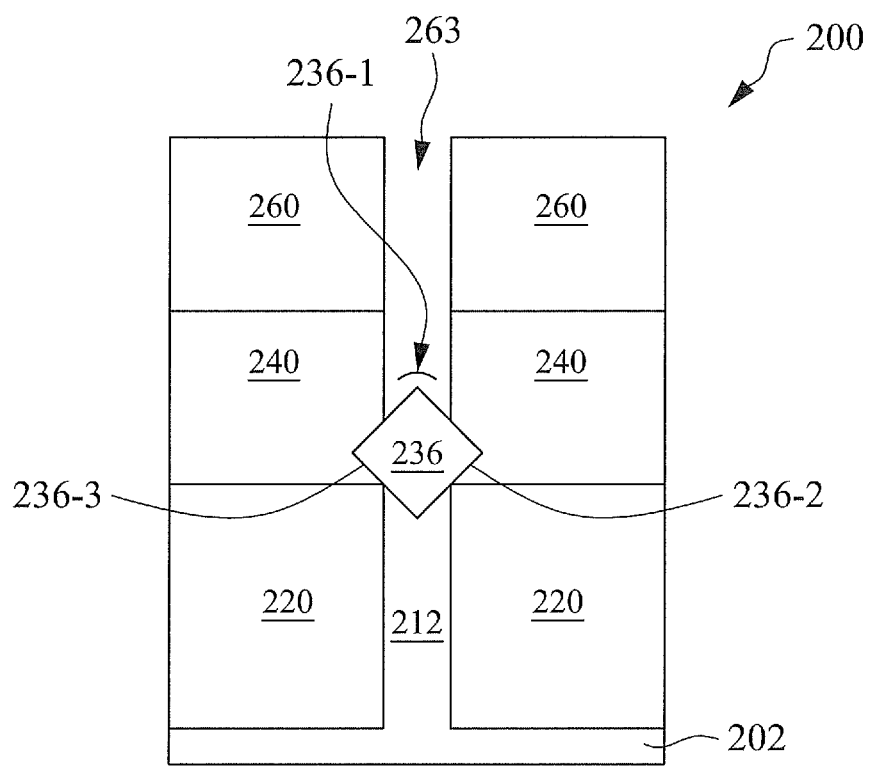
FIGS. 14C and 15C illustrate corresponding cross-sectional views of FIGS. 14A and 15A taken along a second direction, in accordance with some embodiments.
Figure 15A:
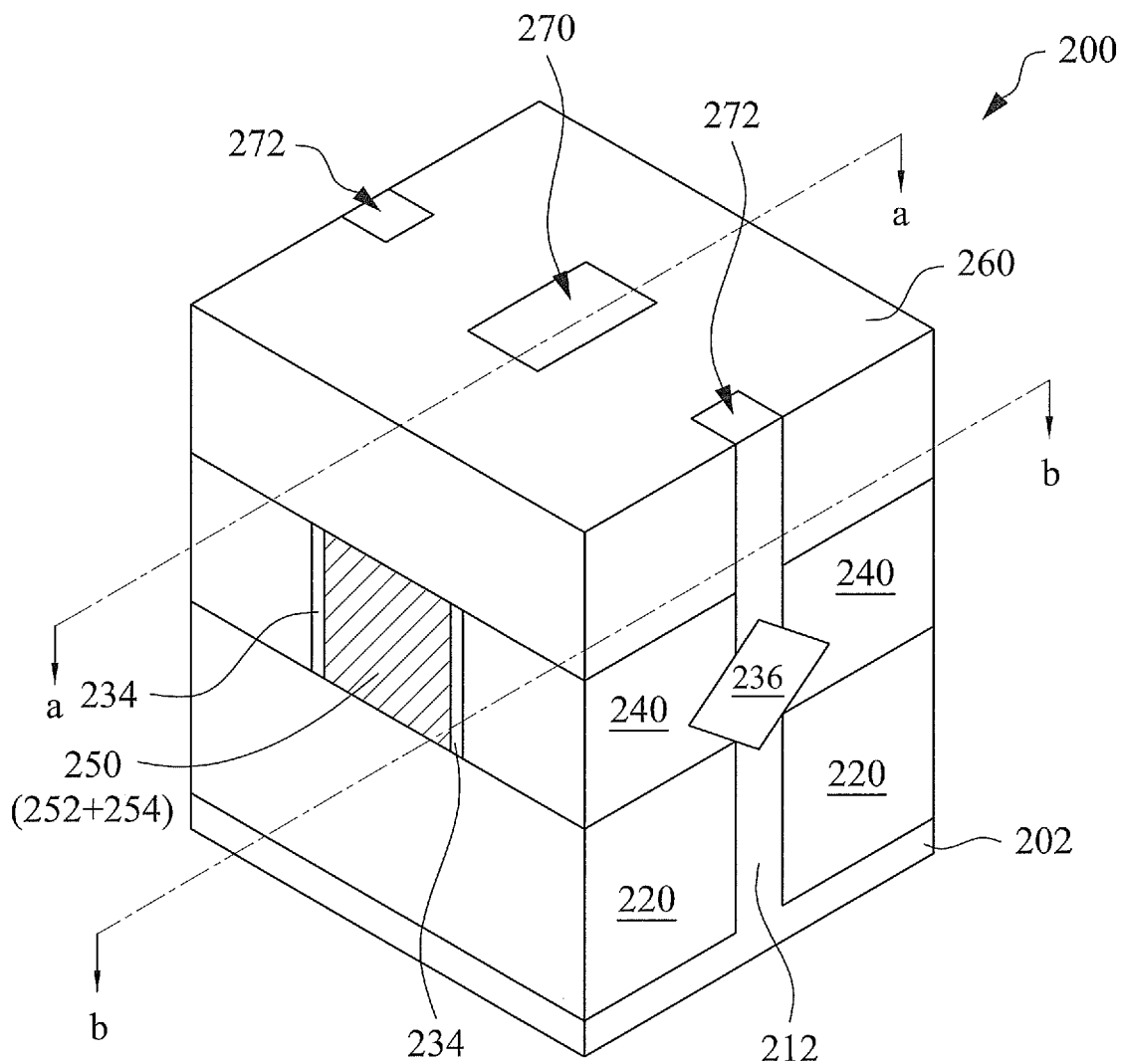

Corresponding to operation 128 of FIG. 1B, FIG. 14A is a perspective view of the FinFET 200 in which the third dielectric layer 260 is recessed to re-expose, at least part of, respective top surfaces of the S/D features 236 and the gate electrode 254 at one of the various stages of fabrication, according to some embodiments, and FIGS. 14B and 14C are cross-sectional views of the FinFET 200 taken along line a-a and line b-b of FIG. 14A, respectively.

As shown, after the third dielectric layer 260 is recessed, openings 261 and 263 are respectively formed. More specifically, in some embodiments, the opening 261 re-exposes a portion of a top surface 254-1 of the gate electrode 254, as better seen in the cross-sectional view of FIG. 14B; and the openings 263 each re-exposes a portion of a top surface 236-1 of one of the S/D features 236, as better seen in the cross-sectional view of FIG. 14C. Although in the illustrated embodiments of FIGS. 14A-14C, the opening 263 re-exposes only the portion of the top surface 236-1, it is noted that the opening 263 may re-expose substantially the whole top surface 236-1 and at least part of side surfaces 236-2 and 236-2 while remaining within the scope of the present disclosure.

In some embodiments, the openings 261 and 263 may be, concurrently or respectively, formed using one or more dry etching processes. More specifically, such one or more dry etching processes include using a plasma of reactive gas that is selected from: fluorocarbons ($CF_4$), hydrogen bromide (HBr), chlorine ($Cl_2$), oxygen (O), nitrogen (N), argon (Ar), helium (He), or a combination thereof.

Figure 15B:
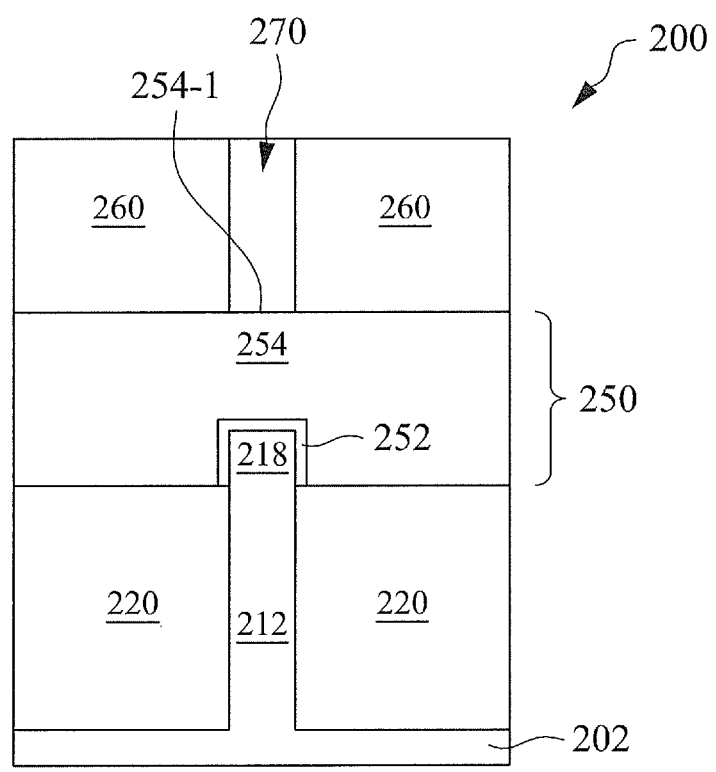
Figure 15C:
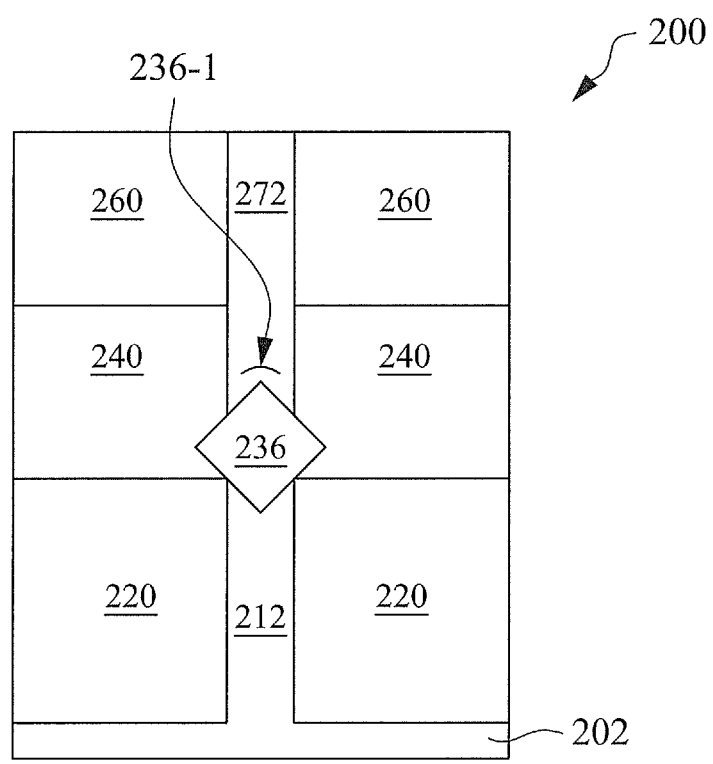

Corresponding to operation 130 of FIG. 1B, FIG. 15A is a perspective view of the FinFET 200 including contact structures 270 and 272, which are formed at one of the various stages of fabrication, according to some embodiments, and FIGS. 15B and 15C are cross-sectional views of the FinFET 200 taken along line a-a and line b-b of FIG. 15A, respectively.

As shown, the contact structure 270 extends through the third dielectric layer 260 and directly contacts the portion of the top surface 254-1 of the gate electrode 254, as better seen in the cross-sectional view of FIG. 15B; and the contact structures 272 each extends through the third dielectric layer 260 and the second dielectric layer 240, and directly contacts the portion of the top surface 236-1 of one of the S/D features 236, as better seen in the cross-sectional view of FIG. 15C. In some embodiments, the contact structures 270 and 272 each includes a tungsten contact that is formed by the fluoride-free CVD technique, which eliminates the aforementioned requirement of forming the fluoride barrier layer prior to forming the tungsten contact. The fluoride-free CVD technique will be discussed in further detail below. In other words, the contact structures 270 and 272 are respectively coupled to the gate electrode 254 and S/D feature 236 without a fluoride barrier layer sandwiched therebetween. As such, the issue of un-scalable fluoride barrier layer, which typically occurs when forming exiting tungsten contacts, can be advantageously eliminated.

In some embodiments, the fluoride-free CVD technique may include performing at least some of the following processes: placing the FinFET 200 with the recessed openings 261 and 263 (FIGS. 14A-14C) in a CVD, or MOCVD, chamber; subliming a metalorganic tungsten-containing compound to a gaseous phase as a tungsten-containing precursor (e.g., tungsten hexacarbonyl ($W(CO)_6$)); mixing the tungsten-containing precursor with a carrier gas (e.g., argon, helium and/or nitrogen); flowing a mixture of the tungsten-containing precursor and the carrier gas to the chamber, wherein a pressure of the chamber is maintained at about 0.1 Torr to about 20 Torr and a temperature of the FinFET 200 is maintained at about 200° C. to about 500° C. As such, the tungsten-containing gas may be decomposed into a plurality of tungsten atoms to refill the recessed openings 261 and 263 with the tungsten atoms so as to form the tungsten contacts 270 and 272. In some embodiments, the decomposition process of the tungsten-containing gas may be represented by the following chemical formula: $W(CO)_6 + 2H^* \rightarrow W + 5CO + H_2CO^*$, wherein the symbol * is generally referred to a radical form of a respective atom/molecule. In some embodiments, after refilling the recessed openings 261 and 263 with the tungsten atoms, a chemical-mechanical polishing process may be performed to polished out excessive tungsten atoms.

In an embodiment, a semiconductor device includes: a fin structure disposed on a substrate; a gate feature that traverses the fin structure to overlay a central portion of the fin structure; a pair of source/drain features, along the fin structure, that are disposed at respective sides of the gate feature; and a plurality of contact structures that are formed of tungsten, wherein a gate electrode of the gate feature and the pair of source/drain features are each directly coupled to a respective one of the plurality of contact structures.

In another embodiment, a semiconductor device includes: a fin structure disposed on a substrate; a gate feature that traverses the fin structure to overlay a central portion of the fin structure; a pair of source/drain features, along the fin structure, that are disposed at respective sides of the gate feature; and a plurality of contact structures, wherein at least part of the plurality of contact structures are formed of tungsten and each directly contacts either a top surface of a gate electrode of the gate feature or a respective top surface of one of the pair of source/drain features.

Yet in another embodiment, a semiconductor device incudes: a conductive feature disposed over a substrate; a dielectric layer disposed over the conductive feature; and a tungsten contact, extending through the dielectric layer, directly contacts the conductive feature.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a fin structure having a first portion extending through a first region comprising a gate feature and a second portion extending through a second region comprising a pair of source/drain features, wherein the first portion of the fin structure has a first height and the second portion of the fin structure has a second height, wherein the first height is greater than the second height; and a gate electrode, of the gate feature, located in a first dielectric layer located above an oxide layer, wherein the first portion of the fin structure vertically extends into the gate electrode, wherein the pair of source/drain features are disposed at respective sides of the gate feature and at least partially located in the oxide layer and at least partially located in the first dielectric layer, wherein bottom surfaces of the pair of source/drain features directly contact respective portions of a top surface of the second portion of the fin structure;

a first contact structure extending through a second dielectric layer located above the first dielectric layer and directly contacting a top surface of the gate electrode of the gate feature; and a second contact structure extending through the second dielectric layer and at least partially through the first dielectric layer to directly contact a source feature of the pair of source/drain features.

2. The device of claim 1, further comprising:
a third contact structure extending through the second dielectric layer at least partially through the first dielectric layer to directly contact a drain feature of the pair of source/drain features.

3. The device of claim 2, wherein the first, second and third contact structures are formed by a fluoride-free chemical vapor deposition technique that uses a precursor of tungsten hexacarbonyl.

4. The device of claim 1, wherein the gate feature further comprises a gate dielectric layer disposed between a central portion of the fin structure and the gate electrode.

5. The device of claim 4, wherein the gate dielectric layer comprises a high-k dielectric layer.

6. The device of claim 1, wherein the fin structure is disposed on a substrate; and
the gate feature traverses the fin structure to overlay a central portion of the fin structure.

7. The device of claim 1, wherein the second dielectric layer is formed of a low-k dielectric material.

8. A semiconductor device, comprising:
a gate feature comprising a gate electrode located in a first dielectric layer located above an oxide layer, wherein the gate feature traverses a fin structure to overlay a central portion of the fin structure, wherein a first portion of the fin structure vertically extends into the gate feature;

a pair of source/drain features that are disposed at respective sides of the gate electrode and at least partially located in the oxide layer and at least partially located in the first dielectric layer, wherein bottom surfaces of the pair of source/drain features directly contact respective portions of a top surface of a second portion of the fin structure, wherein a height of the first portion of the fin structure is higher than a height of the second portion of the fin structure;

a plurality of contact structures extending through a second dielectric layer located above the first dielectric layer;

a first contact structure extending through a second dielectric layer located above the first dielectric layer and directly contacting a top surface of the gate electrode of the gate feature; and a second contact structure extending through the second dielectric layer and at least partially through the first dielectric layer to directly contact a source feature of the pair of source/drain features.

9. The device of claim 8, wherein the at least part of the plurality of contact structures are formed by a fluoride-free chemical vapor deposition technique.

10. The device of claim 9, wherein the fluoride-free chemical vapor deposition technique uses a precursor of tungsten hexacarbonyl.

11. The device of claim 8, wherein the gate feature further comprises a gate dielectric layer disposed between the central portion of the fin structure and the gate electrode.

12. The device of claim 11, wherein the gate dielectric layer comprises a high-k dielectric layer.

13. The device of claim 8, wherein the plurality of contact structures each extends through at least one dielectric layer formed above the gate feature and the pair of source/drain features.

14. The device of claim 13, wherein the at least one dielectric layer is formed of a low-k dielectric material.

15. A semiconductor device, comprising:
a fin structure disposed on a substrate, wherein a first portion of the fin structure extends through a region of a first conductive feature and a second portion of the fin structure extends through a region of a second conductive feature;

the first conductive feature disposed over the substrate and an oxide layer, wherein the first conductive feature is located at least partially in a first dielectric layer, wherein a height of the first portion of the fin structure is higher than a height of the second portion of the fin structure, wherein the first portion of the fin structure vertically extends into the first conductive feature;

a second dielectric layer disposed over the first conductive feature and the first dielectric layer, wherein the second conductive feature at least partially located in the oxide layer and at least partially located in the first dielectric layer, wherein a bottom surface of the second conductive feature directly contacts a top surface of the fin structure;

a first contact extending through the second dielectric layer to contact a top surface of the first conductive feature; and a second contact, extending through the second dielectric layer and partially through the first dielectric layer and directly contacting a top surface of the second conductive feature.

16. The device of claim 15, wherein the first conductive features comprises a gate feature comprising a gate electrode located in the first dielectric layer located above an oxide layer, wherein the gate feature traverses the fin structure to overlay a central portion of the fin structure.

17. The device of claim 16, wherein the first and second contacts are formed by a fluoride-free chemical vapor deposition technique that uses a precursor of tungsten hexacarbonyl.

18. The device of claim 15, wherein the first conductive feature comprises a gate feature of a metal-oxide-semiconductor field-effect-transistor.

19. The device of claim 15, wherein the second dielectric layer is formed of a low-k dielectric material.

20. The device of claim 15 further comprising:
a gate feature that traverses the fin structure to overlay a central portion of the fin structure, wherein the gate feature comprises the first conductive feature and is located in the first dielectric layer located above the oxide layer.

* * * * *